(12) United States Patent  
Park

(10) Patent No.: US 8,760,951 B2  
(45) Date of Patent: *Jun. 24, 2014

(54) METHOD OF READING DATA IN A NON-VOLATILE MEMORY DEVICE

(75) Inventor: Jin Su Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 190 days.

This patent is subject to a terminal disclaimer.

(21) Appl. No.: 13/341,235

(22) Filed: Dec. 30, 2011

(65) Prior Publication Data

US 2012/0099391 A1    Apr. 26, 2012

Related U.S. Application Data

(63) Continuation-in-part of application No. 12/164,014, filed on Jun. 28, 2008, now Pat. No. 8,089,814.

(30) Foreign Application Priority Data

May 26, 2008    (KR) .................................. 2008-48622

(51) Int. Cl.
| | |
|---|---|
| G11C 7/12 | (2006.01) |
| G11C 7/22 | (2006.01) |
| G11C 7/04 | (2006.01) |
| G11C 11/4094 | (2006.01) |
| G11C 11/419 | (2006.01) |

(52) U.S. Cl.
USPC ...................................... 365/203; 365/185.25

(58) Field of Classification Search
None
See application file for complete search history.

(56) References Cited

U.S. PATENT DOCUMENTS

| | | |
|---|---|---|
| 6,084,812 A | 7/2000 | Joo |
| 7,057,958 B2 | 6/2006 | So et al. |
| 2005/0018488 A1* | 1/2005 | Kim et al. ................ 365/185.28 |
| 2005/0036369 A1* | 2/2005 | Lee et al. ................. 365/185.18 |
| 2005/0078537 A1 | 4/2005 | So et al. |
| 2006/0285408 A1 | 12/2006 | Betser et al. |
| 2008/0137460 A1 | 6/2008 | Incarnati et al. |
| 2008/0247228 A1 | 10/2008 | Nguyen et al. |
| 2008/0247238 A1* | 10/2008 | Nguyen et al. ........... 365/185.21 |

FOREIGN PATENT DOCUMENTS

| | | |
|---|---|---|
| CN | 1930634 | 3/2007 |
| CN | 1954389 | 4/2007 |
| JP | 2007-087512 | 4/2007 |
| KR | 1020040005076 | 1/2004 |
| KR | 1020050064033 A | 6/2005 |
| KR | 20060085253 | 9/2006 |

* cited by examiner

*Primary Examiner* — Huan Hoang  
*Assistant Examiner* — James G Norman  
(74) *Attorney, Agent, or Firm* — Kilpatrick Townsend & Stockton LLP

(57) ABSTRACT

A method of reading data in a non-volatile memory device compensates for a change in a reading/verifying result in accordance with a change of temperature. The method includes sensing a temperature of a memory cell, setting a first voltage and a second voltage of a bit line sensing signal in accordance with the sensed temperature so that a difference of the first voltage and the second voltage is increased as the temperature increases, precharging a bit line in accordance with the set first voltage, and sensing data of the memory cell in accordance with the set second voltage. The method may read/verify data constantly even though a temperature is changed.

17 Claims, 5 Drawing Sheets

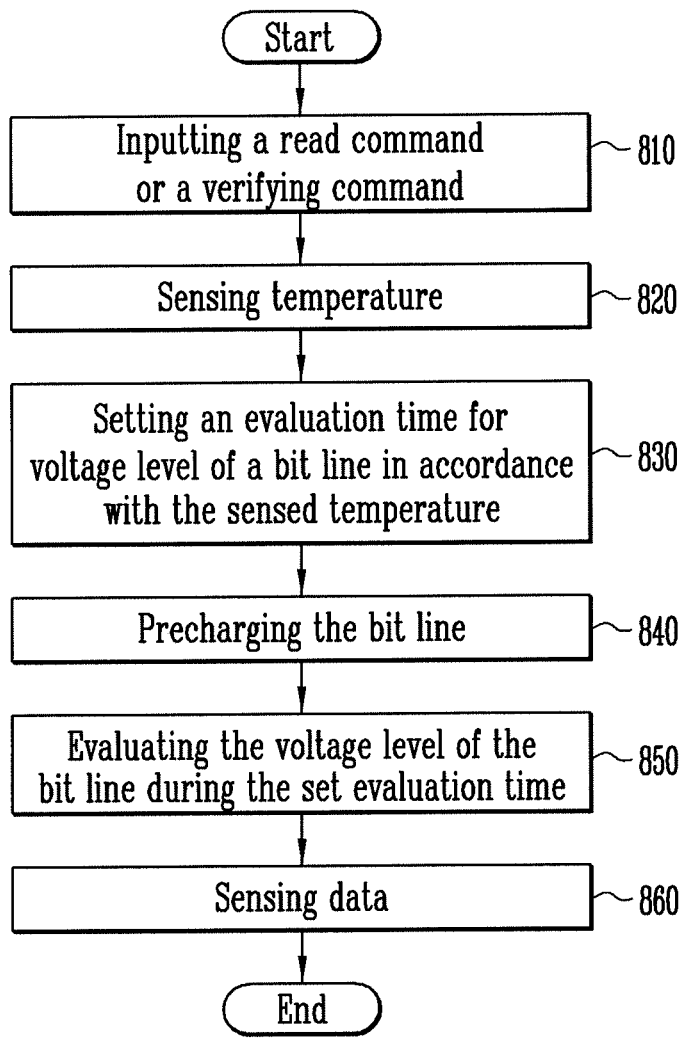
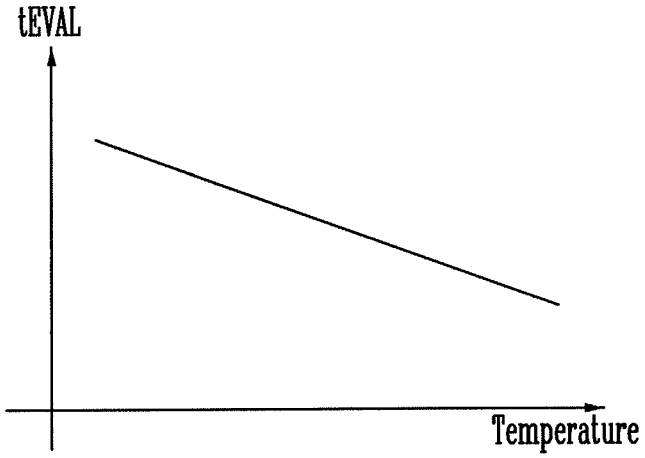

METHOD OF READING DATA IN A NON-VOLATILE MEMORY DEVICE

CROSS-REFERENCE TO RELATED APPLICATIONS

This application is a continuation-in-part of U.S. patent application Ser. No. 12/164,014, filed on Jun. 28, 2008, which claims priority from Korean Patent Application No. 10-2008-0048622, filed on May 26, 2008, the contents of which are incorporated herein by reference in its entirety.

BACKGROUND OF THE INVENTION

The present invention relates to a method of reading data in a non-volatile memory device.

Recently, the demand has increased for a non-volatile memory device which electrically programs and erases data, and does not require a refresh function of periodically rewriting data.

The non-volatile memory device performs a program operation and an erase operation by changing a threshold voltage of a memory cell through movement of electrons by a high electric field applied to a thin oxide film.

The non-volatile memory device generally includes a memory cell array in which memory cells for storing data are disposed with a matrix shape, and a page buffer for programming data in a specific memory cell in the memory cell array or reading data from a given memory cell.

The page buffer has a pair of bit lines coupled to memory cells, a register for temporarily storing data to be programmed to the memory cell array or data read from a given memory cell of the memory cell array, a sensing node for sensing a voltage level of a specific bit line or the register, and a bit line select circuit for controlling connection of the bit line and the sensing node.

A read operation and a verifying operation in the non-volatile memory device determine whether or not a threshold voltage of a memory cell to be read is more than a read voltage or a verifying voltage.

However, the memory cell may be read with a threshold voltage different from a desired threshold voltage due to a change of temperature. As a result, a read margin is reduced or a state of a memory cell in accordance with the read operation and the verifying operation is different from a desired state.

SUMMARY OF THE INVENTION

It is a feature of the present invention to provide a method of reading data in a non-volatile memory device that compensates for a change in a reading/verifying result in accordance with a change of temperature.

A method of reading data in a non-volatile memory device according to one example embodiment of the present invention includes sensing a temperature of a memory cell, setting a first voltage and a second voltage of a bit line sensing signal in accordance with the sensed temperature so that a difference of the first voltage and the second voltage is increased as the temperature increases, precharging a bit line in accordance with the set first voltage, and sensing data of the memory cell in accordance with the set second voltage.

A non-volatile memory device according to one example embodiment of the present invention includes a cell string comprising a plurality of memory cells, wherein the cell string is coupled to a bit line, a temperature sensor configured to sense a temperature of the memory cells, a bit line sensing circuit configured to precharge the bit line in response to a first bit line sensing signal and sense a voltage level of the bit line to sense data of the memory cell in response to a second bit line sensing signal, and a control circuit configured to output the first bit line sensing signal of a first voltage and the second bit line sensing signal of a second voltage in accordance with the sensed temperature, wherein the difference of the first voltage and the second voltage is increased as the temperature increases.

A method of reading data in a non-volatile memory device according to another example embodiment of the present invention includes sensing a temperature of a memory cell; setting a first voltage and a second voltage of a bit line sensing signal in accordance with the sensed temperature so that a difference of the first voltage and the second voltage is increased as the temperature is increased; setting a time interval for evaluating a voltage level of a bit line in accordance with the sensed temperature; precharging the bit line in accordance with the set first voltage; evaluating the voltage level of the bit line during the set evaluation time interval; and sensing data of the memory cell in accordance with the set second voltage.

As described above, a method of reading data in a non-volatile memory device of the present invention may read data constantly even though a temperature is changed. This method may be applied to a verifying method. That is, a change of a reading/verifying result in accordance with a change of temperature may be compensated for in the verifying operation.

BRIEF DESCRIPTION OF THE DRAWINGS

The above and other features and advantages of the present invention will become readily apparent with reference to the following detailed description when considered in conjunction with the accompanying drawings wherein:

FIG. 8 is a flowchart illustrating a read operation/verifying operation of the non-volatile memory device according to another example embodiment of the present invention; and FIG. 9 is a view illustrating a method of setting an evaluation time for a voltage level of the bit line in a read operation of the non-volatile memory device according to one example embodiment of the present invention.

DESCRIPTION OF SPECIFIC EMBODIMENTS

Hereinafter, the preferred embodiments of the present invention will be explained in detail with reference to the accompanying drawings.

Figure 1:
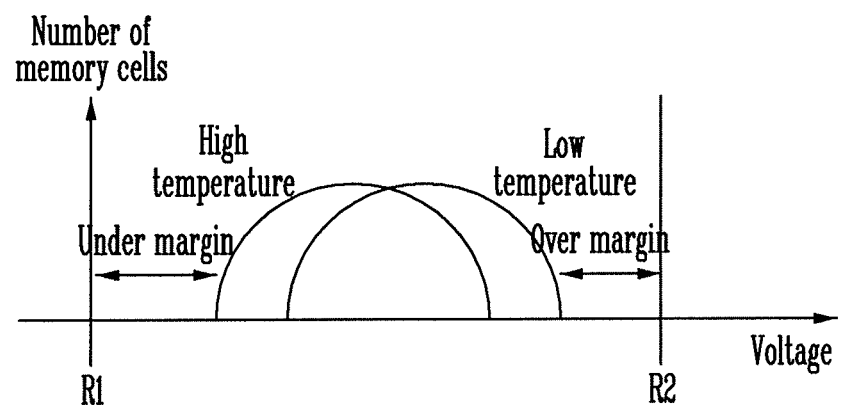
FIG. 1 is a view illustrating a change of a read margin in accordance with a temperature of a common non-volatile memory device.

FIG. 1 is a view illustrating a change of a read margin in accordance with a temperature of a common non-volatile memory device.

Since memory cells in a non-volatile memory device have different characteristics, the memory cells do not have the same threshold voltage distributions. This may be generated by various causes, e.g. a change of temperature.

When a specific memory cell is programmed at a high temperature and then is read at a low temperature, a threshold voltage obtained by the read operation is higher than that of the programmed memory cell. Hence, a difference of a threshold voltage of a memory cell having a highest threshold voltage and a second read voltage R2, i.e. over margin, becomes narrower. As a result, a difference of a threshold voltage distribution of the memory cell and a threshold voltage distribution of a memory cell having a threshold voltage higher than the second read voltage R2 becomes narrower. Thus, a problem may result when a method of programming a multi level cell is applied to the non-volatile memory device.

However, when a specific memory cell is programmed at a low temperature and then is read at a high temperature, a threshold voltage obtained by the read operation is smaller than that of the programmed memory cell. Hence, a difference of a threshold voltage of a memory cell having a smallest threshold voltage and a first read voltage R1, i.e. under margin, becomes narrower. As a result, a difference of a threshold voltage distribution of the memory cell and a threshold voltage distribution of an erased memory cell becomes narrower. Thus, the programmed memory cell may be read as an erased memory cell.

Figure 2:
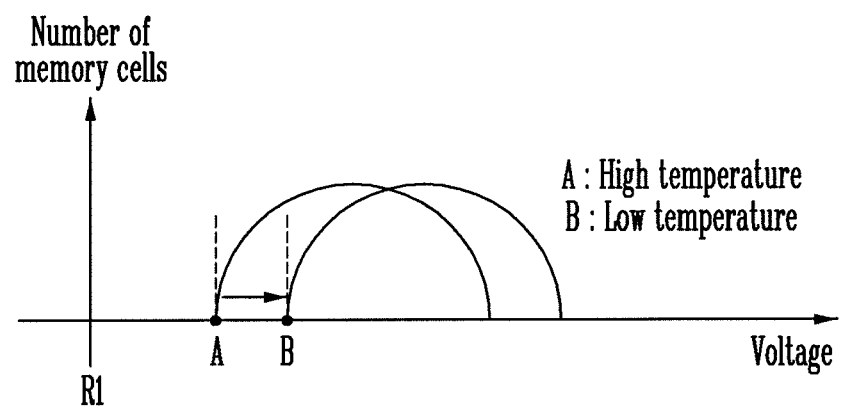
FIG. 2 is a view illustrating a current change of a memory cell in accordance with a temperature of the non-volatile memory device.
Figure 2:
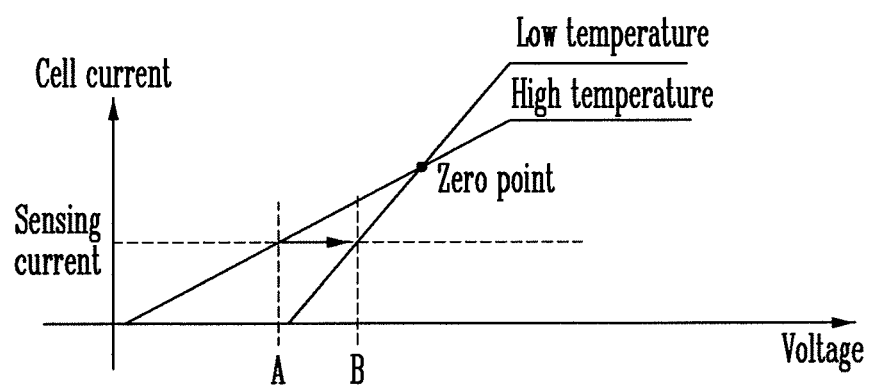

FIG. 2 is a view illustrating a current change of a memory cell in accordance with a temperature of the non-volatile memory device.

When a memory cell having a threshold voltage A of memory cells programmed at a high temperature is read at a low temperature, the threshold voltage of the memory cell is read as B. That is, the threshold voltage B obtained by the read operation is higher than that of the programmed memory cell. This is because a slope in a cell current graph increases as current passing through a cell string at a low temperature is increased.

As shown in FIG. 2, a current change rate of a memory cell in accordance with a voltage of a word line at a low temperature is higher than that of the memory cell in accordance with a voltage of the word line at a high temperature.

When a voltage smaller than the zero point is applied to the memory cell, a sensing current at a low temperature is smaller than that at a high temperature as shown in FIG. 2. Here, the zero point refers to a cross point of the two graphs.

In addition, when the sensing current, used for determining whether a memory cell for the read operation is programmed to a voltage more than a reference voltage, is passed through the cell string, a voltage at a high temperature is higher than that at a low temperature.

In brief, the threshold voltage of the memory cell in accordance with the read operation is varied in accordance with temperature.

Figure 3:
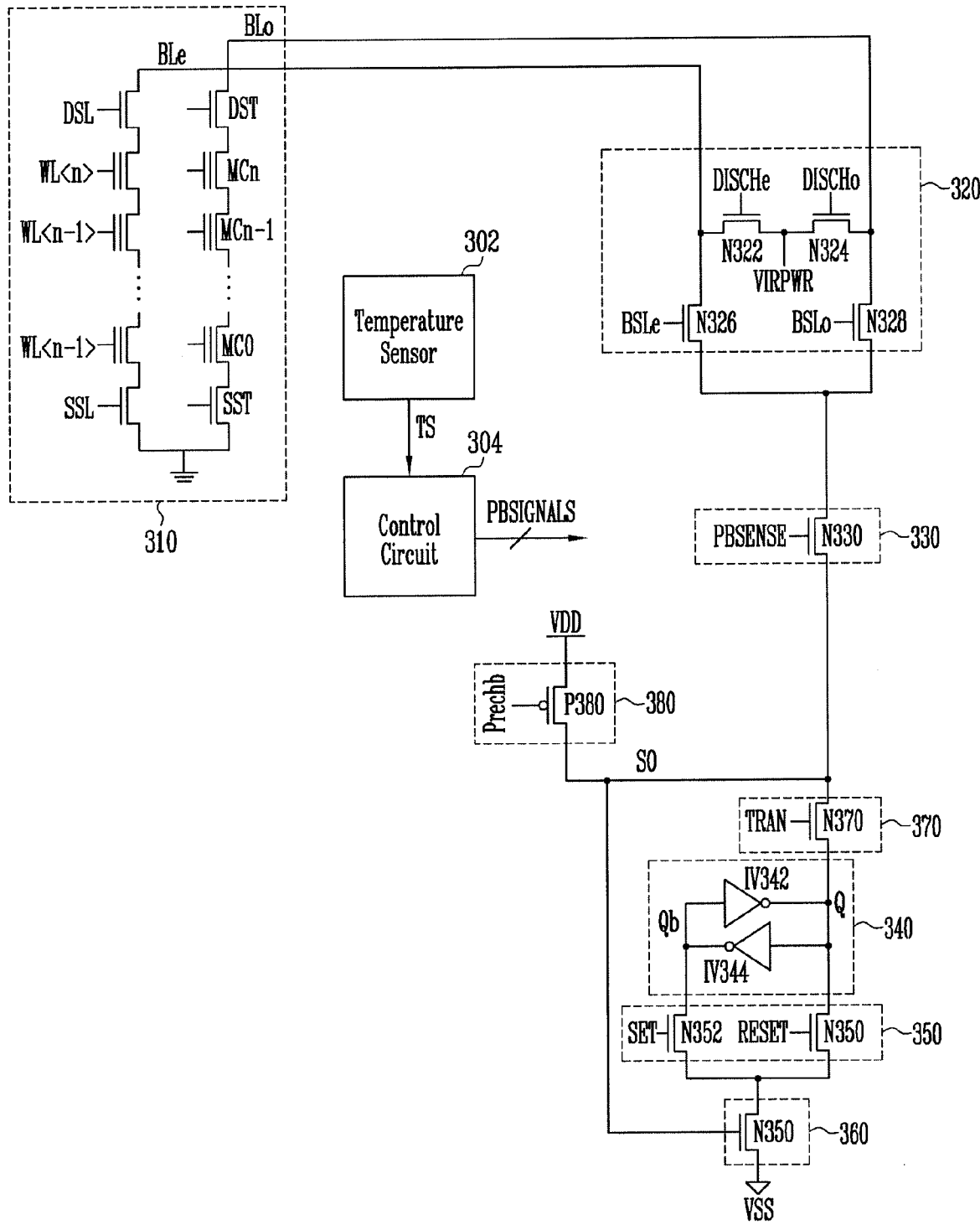
FIG. 3 is a view illustrating a non-volatile memory device according to one example embodiment of the present invention.

FIG. 3 is a view illustrating a non-volatile memory device according to one example embodiment of the present invention.

The non-volatile memory device 300 of the present embodiment includes a temperature sensor 302, a control circuit 304, a memory cell array 310 having memory cells, a bit line select circuit 320, a bit line sensing circuit 330, a data latching circuit 340, a data setting circuit 350, a sensing node sensing circuit 360, a data transmitting circuit 370 and a sensing node precharging circuit 380.

The temperature sensor 302 senses a temperature of the memory cells.

The control circuit 304 controls the bit line select circuit 320, the bit line sensing circuit 330, the data latching circuit 340, the data setting circuit 350, the sensing node sensing circuit 360, the data transmitting circuit 370 and the sensing node precharging circuit 380 by outputting control signals PBSIGNALS.

The bit line select circuit 320 selectively couples a bit line coupled to a specific memory cell to the bit line select circuit 330.

The bit line sensing circuit 330 selectively couples the bit line select circuit 320 to a sensing node SO.

The data latching circuit 340 temporarily stores data to be programmed to a specific memory cell, or temporarily stores data read from a certain memory cell.

The data setting circuit 350 inputs data to be stored in the data latching circuit 340.

The sensing node sensing circuit 360 applies a ground voltage to a specific node of the data latching circuit 340 in accordance with a level of the sensing node SO.

The data transmitting circuit 370 transmits the data stored in the data latching circuit 340 to the sensing node SO.

The sensing node precharging circuit 380 applies a voltage having a high level to the sensing node SO.

The memory cell array 310 includes memory cells for storing data, word lines for activating selected memory cells, and bit lines BLe and BLo for inputting/outputting data of the memory cell. Here, the word lines and the bit lines BLe and BLo are configured as a matrix shape.

The memory cell array 310 further includes a drain select transistor DST coupled between the bit line and the memory cell, and a source select transistor SST coupled between a common source line and the memory cell.

In addition, memory cells are provided in series between the source select transistor SST and the drain select transistor DST, and are included in one cell string.

Gates of the memory cells are coupled to the word lines. Here, a group having memory cells coupled in common to the same word line is referred to as a page. Additionally, cell strings coupled to the bit lines are coupled in parallel to the common source line, and form one block.

The bit line select circuit 320 includes an N-MOS transistor N326 for coupling the even bit line BLe to the bit line sensing circuit 330 in response to a first bit line select signal BSLe, and an N-MOS transistor N328 for coupling the odd bit line BLo to the bit line sensing circuit 330 in response to a second bit line select signal BSLo.

Furthermore, the bit line select circuit 320 further includes a variable voltage inputting terminal for providing a variable voltage VIRPWR having a specific level, an N-MOS transistor N322 for coupling the even bit line BLe to the variable voltage inputting terminal in response to a first discharge signal DISCHe, and an N-MOS transistor N324 for coupling the odd bit line BLo to the variable voltage inputting terminal in response to a second discharge signal DISCHo.

The bit line sensing circuit 330 includes an N-MOS transistor N330 for selectively coupling the bit line select circuit 320 to the sensing node SO in response to a bit line sensing signal PBSENSE. A read operation or a verifying operation is performed by controlling a voltage of the bit line sensing signal PBSENSE. In the read operation or the verifying operation, the bit line sensing circuit 330 precharges the bit lines in response to a first bit line sensing signal and senses a voltage level of the bit line to sense data of the memory cells in response to a second bit line sensing signal. This will be described in detail with reference to the accompanying drawings.

In another example embodiment of the present invention, the non-volatile memory device does not include the bit line sensing circuit 330. However, the N-MOS transistors N326 and N328 may play a role in the bit line select circuit 320.

The sensing node precharging circuit 380 applies the voltage VDD having a high level to the sensing node SO in response to a precharge signal Prechb, and has a P-MOS transistor P380 coupled between a terminal corresponding to the voltage VDD and the sensing node SO. Accordingly, the sensing node precharging circuit 380 applies the voltage VDD to the sensing node SO in response to the precharge signal Prechb having a low level.

The data latching circuit 340 temporarily stores data to be programmed to a specific memory cell, or temporarily stores data read from a given memory cell. In the data latching circuit 340, an output terminal of a first inverter IV342 is coupled to an input terminal of a second inverter IV344, and an output terminal of the second inverter IV344 is coupled to an input terminal of the first inverter IV342. Here, a couple node of the output terminal of the first inverter IV342 and the input terminal of the second inverter IV344 is referred to as a first node Q, and a couple node of the output terminal of the second inverter IV344 and the input terminal of the first inverter IV342 is referred to as a second node Qb.

The data setting circuit 350 includes an N-MOS transistor N350 for applying a ground voltage to the first node Q of the data latching circuit 340 and an N-MOS transistor N352 for providing the ground voltage to the second node Qb. The N-MOS transistor N350 is coupled between the sensing node sensing circuit 360 and the first node Q, and applies the ground voltage provided from the sensing node sensing circuit 360 to the first node Q in response to a first data setting signal RESET. In addition, the N-MOS transistor N352 is coupled between the sensing node sensing circuit 360 and the second node Qb, and applies the ground voltage provided from the sensing node sensing circuit 360 to the second node Qb in response to a second data setting signal SET.

The sensing node sensing circuit 360 applies the ground voltage to the data setting circuit 350 in accordance with a voltage level of the sensing node SO, and has an N-MOS transistor N360 coupled between the data setting circuit 350 and a ground terminal. Accordingly, the sensing node sensing circuit 360 applies the ground voltage to the data setting circuit 350 in accordance with the voltage level of the sensing node SO. The sensing node sensing circuit 360 applies the ground voltage to the data setting circuit 350 when a voltage of the sensing node SO has a high level. When the first data setting signal RESET having a high level is transmitted, the ground voltage is applied to the first node Q. That is, data having a low level is provided to the first node Q. However, when the second data setting signal SET having a high level is transmitted, the ground voltage is applied to the second node Qb. In other words, data having a high level is provided to the first node Q.

The data transmitting circuit 370 selectively transmits the data of the first node Q of the data latching circuit 340 to the sensing node SO, and includes a data transmitting transistor N370 for selectively coupling the first node Q to the sensing node SO in response to a data transmitting signal TRAN.

The control circuit 304 outputs the first bit line select signal BSLe, the second bit line select signal BSLo, the first discharge signal DISCHe, the second discharge signal DISCHo, the bit line sensing signal PBSENSE, the precharge signal Prechb, the first data setting signal RESET, the second data setting signal SET and the data transmitting signal TRAN. The control circuit outputs the first bit line sensing signal of a first voltage and the second bit line sensing signal of a second voltage in accordance with the sensed temperature by the temperature sensor 302. The difference of the first voltage and the second voltage is increased as the temperature increases. It will be described in detail.

Hereinafter, a read operation or a verifying operation in the above non-volatile memory device will be described in detail.

Figure 4:
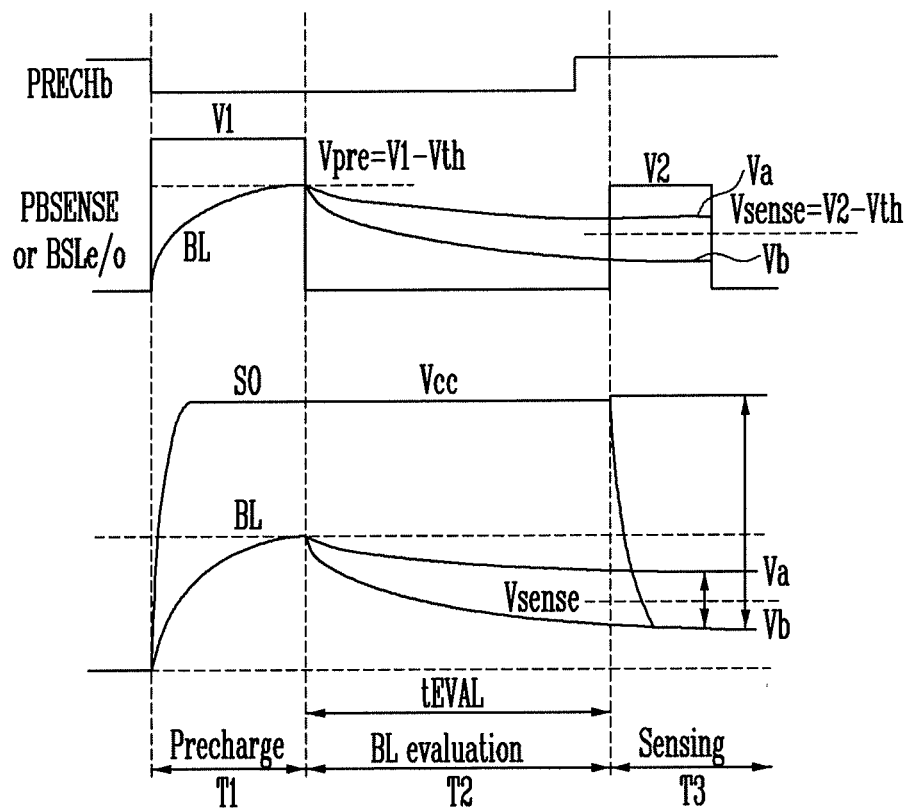
FIG. 4 is a view illustrating waveforms of signals transmitted in a read operation or a verifying operation of a common non-volatile memory device.

FIG. 4 is a view illustrating waveforms of signals transmitted in a read operation or a verifying operation of a common non-volatile memory device.

In interval T1, the sensing node precharging circuit 380 precharges the sensing node SO to a high level in accordance with the precharge signal Prechb having a low level. Additionally, the bit line sensing circuit 330 transmits the bit line sensing signal PBSENSE having a first voltage V1 to the bit line sensing circuit 330. As a result, the bit line BLe/BLo is precharged to a first precharge voltage (V1−Vth). When the non-volatile memory device does not include the bit line sensing circuit 330, the bit line BLe/BLo is precharged to the first precharge voltage (V1−Vth) by transmitting the bit line select signal BSLe/BSLo to the transistor N326/N328.

In interval T2, a voltage level of the bit line is changed in a bit line evaluation interval in accordance with a threshold voltage of a memory cell for the read operation/verifying operation. To perform the above operation, transmission of the bit line sensing signal PBSENSE or the bit line select signal BSLe/BSLo is stopped, and the bit line and the sensing node SO is disconnected.

In addition, a pass voltage is applied to the word lines, thereby turning on memory cells except the memory cell for the read operation/verifying operation in the cell string. A reference voltage is applied to a word line related to the memory cell for the read operation/verifying operation. Since the memory cell is not turned on when a threshold voltage of the memory cell is higher than the reference voltage, a current path is not formed between the cell string and ground. Accordingly, a voltage level of the precharged bit line is not changed much.

However, since the memory cell for the read operation/verifying operation is turned on when the threshold voltage of the memory cell is smaller than the reference voltage, a current path is formed between the cell string and ground. Accordingly, the bit line is discharged. As a result, the voltage of the bit line is changed to a voltage Va or Vb as shown in FIG. 4 in accordance with whether the memory cell for the read operation/verifying operation is programmed.

In interval T3, the voltage level of the bit line is sensed, and data corresponding to the sensed voltage level is stored in the data latching circuit 340. To perform the above operation, the bit line sensing signal PBSENSE or the bit line select signal BSLe/BSLo is transmitted with a second voltage V2. Additionally, since transmission of the precharge signal Prechb is stopped, the sensing node SO has a floating state, i.e. maintains a high level.

When the voltage of the bit line is more than a critical value (V2−Vth), i.e. when the threshold voltage of the memory cell for the read operation/verifying operation is higher than the reference voltage, the N-MOS transistor N330 of the bit line sensing circuit 330 is not turned on.

When the non-volatile memory device does not include the bit line sensing circuit 330, the N-MOS transistors N326 and N328 of the bit line select circuit 320 are not turned on. Hence, the sensing node SO maintains a high level, and specific data is stored in the data latching circuit 340 by the sensing node sensing circuit 360.

However, when the voltage of the bit line is smaller than the critical value (V2−Vth), i.e. when the threshold voltage of the memory cell for the read operation/verifying operation is smaller than the reference voltage, the N-MOS transistor N330 of the bit line sensing circuit 330 is turned on.

When the non-volatile memory device does not include the bit line sensing circuit 330, the N-MOS transistors N326 and N328 of the bit line select circuit 320 are turned on. Hence, the sensing node SO is coupled to the bit line having a low level, and the sensing node SO is discharged to a low level. As a result, the sensing node sensing circuit 360 is not operated, and the data stored in the data latching circuit 340 is maintained.

The read operation or the verifying operation is performed with the above constitution.

Figure 5:
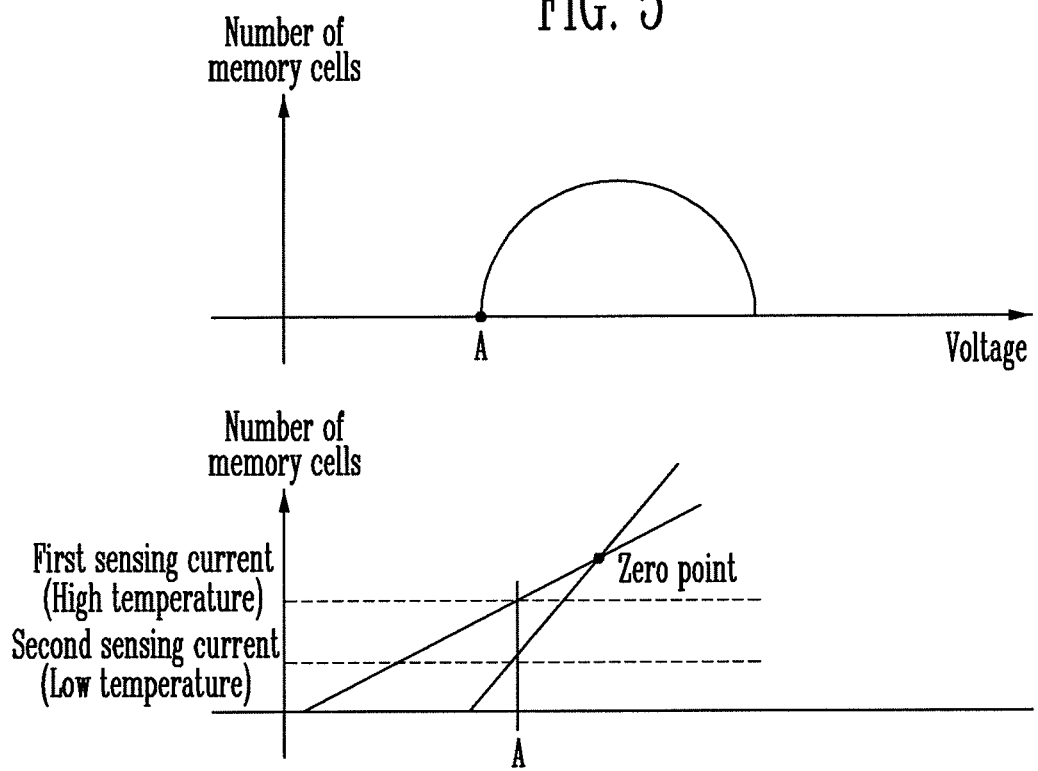
FIG. 5 is a view illustrating a read operation/verifying operation of the non-volatile memory device according to one example embodiment of the present invention.

FIG. 5 is a view illustrating a read operation/verifying operation of the non-volatile memory device according to one example embodiment of the present invention.

As described above, a problem exists because the sensing current applied at a low temperature is higher than the sensing current applied at a high temperature.

The voltage level of the bit line in the bit line evaluation interval is determined by the sensing current. That is, the voltage of the bit line is discharged by an amount calculated by Equation 1.

$$VBLdis = \frac{Icell * teval}{Cbl},\quad\text{[Equation 1]}$$

where Icell is the sensing current, teval is an evaluation time, and Cbl is a bit line capacitance.

The non-volatile memory device of the present invention detects an outside temperature, and then controls the sensing current in accordance with the detected temperature so that a small sensing current is applied at a low temperature and a relatively higher sensing current is applied at a high temperature. As a result, a difference of the sensing current in accordance with a change of temperature is minimized.

Hereinafter, two methods for controlling the sensing current will be described in detail.

A first method adjusts the sensing current by controlling a voltage level of the bit line sensing signal PBSENSE or the bit line select signal BSLe/BSLo, i.e. the first voltage V1 applied in a precharge step and the second voltage V2 applied when the data is sensed.

A second method controls the evaluation time for the voltage level of the bit line. This will be described in detail with reference to the accompanying drawings.

Figure 6:
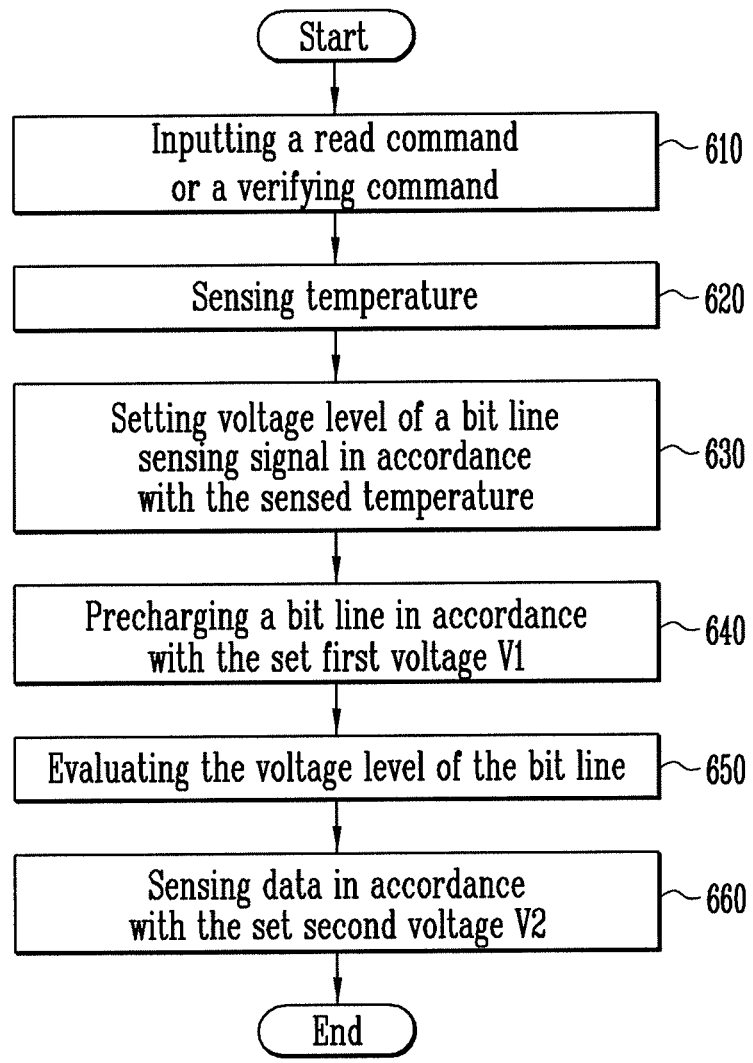
FIG. 6 is a flowchart illustrating a read operation/verifying operation in a non-volatile memory device according to one example embodiment of the present invention.

FIG. 6 is a flowchart illustrating a read operation/verifying operation in a non-volatile memory device according to one example embodiment of the present invention.

In step S610, a read command or a verifying command is input.

In step S620, a temperature of memory cells is sensed. In one example embodiment of the present invention, the non-volatile memory device senses the temperature by using a temperature sensor to control a voltage level of the bit line sensing signal PBSENSE or the bit line select signal BSLe/BSLo.

In step S630, the voltage level of the bit line sensing signal PBSENSE or the bit line select signal BSLe/BSLo is set in accordance with the sensed temperature.

Figure 7:
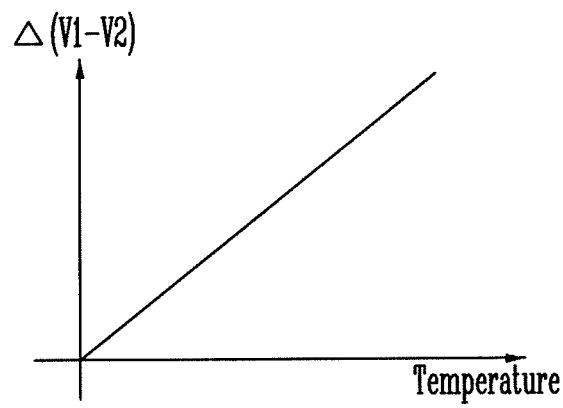
FIG. 7 is a view illustrating a method of setting the voltage level of the bit line sensing signal or the bit line select signal in accordance with a temperature during the read operation/verifying operation of the non-volatile memory device according to one example embodiment of the present invention.

FIG. 7 is a view illustrating a method of setting the voltage level of the bit line sensing signal or the bit line select signal in accordance with a temperature during the read operation/verifying operation of the non-volatile memory device according to one example embodiment of the present invention.

As shown in FIG. 7, the voltage of the bit line sensing signal PBSENSE or the voltage of the bit line select signal BSLe/BSLo applied in the precharge step, i.e. the first voltage V1, and the voltage of the bit line sensing signal PBSENSE applied or the voltage of the bit line select signal BSLe/BSLo applied in the data sensing step, i.e. the second voltage V2, are set so that the difference of the voltages V1 and V2 is increased. In other words, the difference of the voltages V1 and V2 is increased at a high temperature, and the difference of the voltages V1 and V2 is reduced at a low temperature. Accordingly, the first voltage V1 is increased or the second voltage V2 is reduced at a high temperature. In addition, the first voltage V1 is reduced or the second voltage V2 is increased at a low temperature.

Now referring to FIG. 6, in step S640, the bit line is precharged in accordance with the set first voltage V1.

As mentioned above, the bit line sensing signal PBSENSE or the bit line select signal BSLe/BSLo having the first voltage V1 is transmitted when the sensing node SO is precharged to a high level.

When the first voltage V1 is increased because the temperature is high, the voltage level of the precharged bit line increases. Accordingly, the sensing current is increased. However, when the first voltage V1 is reduced because the temperature is low, the voltage level of the precharged bit line decreases. Accordingly, the sensing current is reduced.

In step S650, the voltage level of the bit line is evaluated during an evaluation interval in accordance with a state of a memory cell to be read or verified.

In step S660, a data sensing operation is performed in accordance with the set second voltage V2. To perform the data sensing operation, the bit line sensing signal PBSENSE or the bit line select signal BSLe/BSLo having the second voltage V2 is transmitted. In addition, transmission of the precharge signal Prechb is stopped, and thus the sensing node SO has a floating state, i.e. maintains a high level.

Since the second voltage V2 is reduced at a high temperature, the memory cell obtained by the read operation may be sensed as a programmed memory cell even though the voltage level of the bit line is considerably reduced. However, the second voltage V2 is increased at a low temperature. The memory cell may be sensed as a programmed memory cell when the voltage level of the bit line is not considerably decreased.

In brief, the non-volatile memory device of the present invention controls the first voltage V1 and the second voltage V2 in accordance with the sensed temperature, thereby compensating for the varying sensing current due to the temperature change.

FIG. 8 is a flowchart illustrating a read operation/verifying operation of the non-volatile memory device according to another example embodiment of the present invention.

In step S810, a read command or a verifying command is input.

In step S820, a temperature of memory cells is sensed.

In one example embodiment of the present invention, the non-volatile memory device senses the temperature by using a temperature sensor, and controls an evaluation time for the voltage level of the bit line in accordance with the sensed temperature.

In step S830, the evaluation time is set in accordance with the sensed temperature. The evaluation time may be controlled through a controller included in the non-volatile memory device.

FIG. 9 is a view illustrating a method of setting an evaluation time for a voltage level of the bit line in a read operation of the non-volatile memory device according to one example embodiment of the present invention.

As shown in FIG. 9, the non-volatile memory device sets the evaluation time teval so that the evaluation time teval is reduced when the temperature increases.

Particularly, the evaluation time teval is reduced at a high temperature. When the evaluation time teval is reduced, the sensing current is increased in accordance with the above Equation 1.

The evaluation time teval is increased at a low temperature. As a result, the sensing current may be reduced.

At room temperature, the evaluation time teval is maintained at a constant value.

In step S840, the bit line is precharged in accordance with the first voltage V1. As mentioned above, the bit line sensing signal PBSENSE or the bit line select signal BSLe/BSLo having the first voltage V1 is transmitted when the sensing node SO is precharged to a high level.

In step S850, the voltage level of the bit line is evaluated during the set evaluation time in accordance with a state of a memory cell for a read operation/verifying operation.

The voltage of the bit line is increasingly discharged as the evaluation time is increased. That is, the amount of charges that are discharged increases as the evaluation time is augmented irrespective of whether the memory cell is programmed. This has the same effect as in the above method of reducing the second voltage V2 as shown in FIG. 4.

In step S860, a data sensing operation is performed in accordance with the set second voltage V2.

To perform the data sensing operation, the bit line sensing signal PBSENSE or the bit line select signal BSLe/BSLo having the second voltage V2 is transmitted.

Additionally, transmission of the precharge signal Prechb is stopped, and thus the sensing node SO has a floating state, i.e. maintains a high level.

In short, the non-volatile memory device controls the evaluation time teval in accordance with the sensed temperature, thereby compensating for the varying sensing current due to the changed temperature.

The sensing current may be compensated for using the methods in FIG. 6 and FIG. 8. In other words, the non-volatile memory device controls the first voltage V1 and the second voltage V2 to change a difference of the first voltage V1 and the second voltage V2, and controls the evaluation time teval in accordance with the sensed temperature. As a result, the varying sensing current due to the changed temperature is compensated.

Any reference in this specification to "one embodiment," "an embodiment," "example embodiment," etc., means that a particular feature, structure, or characteristic described in connection with the embodiment is included in at least one embodiment of the invention. The appearance of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other embodiments.

Although the present invention has been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of reading data in a non-volatile memory device, the method comprising:
    sensing a temperature of a memory cell;
    setting a first voltage and a second voltage of a bit line sensing signal in accordance with the sensed temperature so that a difference of the first voltage and the second voltage is increased as the temperature increases;
    precharging a bit line in accordance with the set first voltage; and
    sensing data of the memory cell in accordance with the set second voltage,
    wherein the first voltage is increased as the temperature increases.

2. The method of claim 1, wherein the second voltage is reduced as the temperature increases.

3. The method of claim 1, wherein the first voltage is reduced as the temperature decreases.

4. The method of claim 1, wherein the second voltage is increased as the temperature decreases.

5. A non-volatile memory device, comprising:
    a cell string comprising a plurality of memory cells, wherein the cell string is coupled to a bit line;
    a temperature sensor configured to sense a temperature of the memory cells;
    a bit line sensing circuit configured to precharge the bit line in response to a first bit line sensing signal and sense a voltage level of the bit line to sense data of the memory cell in response to a second bit line sensing signal; and
    a control circuit configured to output the first bit line sensing signal of a first voltage and the second bit line sensing signal of a second voltage in accordance with the sensed temperature, wherein the difference of the first voltage and the second voltage is increased as the temperature increases, and wherein the first voltage is increased as the temperature increases.

6. The non-volatile memory device of claim 5, further comprising:
    a sensing node precharging circuit configured to precharge a sensing node in response to a precharge signal, wherein the bit line sensing circuit couples the sensing node to the bit line in response to the first bit line sensing signal to precharge the bit line; and
    a latch circuit configured to latch data of the memory cell in accordance with a voltage level of the sense node.

7. The non-volatile memory device of claim 6, wherein the latch circuit comprises:
    a data latch configured to store data to be programmed to a memory cell or store data read from a memory cell;

a data setting circuit configured to input data to be stored in the data latch;

a sensing node sensing circuit configured to apply a ground voltage to a specific node of the data circuit in accordance with the voltage level of the sensing node; and a data transmitting circuit configured to transmit the data stored in the data latch to the sensing node.

8. The non-volatile memory device of claim 5, wherein the second voltage is reduced as the temperature increases.

9. The non-volatile memory device of claim 5, wherein the first voltage is reduced as the temperature decreases.

10. The non-volatile memory device of claim 5, wherein the second voltage is increased as the temperature decreases.

11. A method of reading data in a non-volatile memory device, the method comprising:

sensing a temperature of a memory cell;

setting a first voltage and a second voltage of a bit line sensing signal in accordance with the sensed temperature so that a difference of the first voltage and the second voltage is increased as the temperature is increased;

setting a time interval for evaluating a voltage level of a bit line in accordance with the sensed temperature;

precharging the bit line in accordance with the set first voltage;

evaluating the voltage level of the bit line during the set evaluation time interval; and sensing data of the memory cell in accordance with the set second voltage, wherein the first voltage is increased as the temperature increases.

12. The method of claim 11, wherein the evaluation time interval is reduced as the temperature increases.

13. The method of claim 11, wherein the evaluation time interval is increased as the temperature decreases.

14. The method of claim 11, further comprising discharging the voltage level of the bit line, wherein the voltage level of the bit line is increasingly discharged as the evaluation time interval increases.

15. The method of claim 11, wherein the second voltage is reduced as the temperature increases.

16. The method of claim 11, wherein the first voltage is reduced as the temperature decreases.

17. The method of claim 11, wherein the second voltage is increased as the temperature decreases.

* * * * *